(12) United States Patent
Streett

(10) Patent No.: US 10,573,772 B2
(45) Date of Patent: Feb. 25, 2020

(54) COMPOSITE VEHICLE SKIN CO-CURED WITH SOLAR-CELL ARRAY

(71) Applicant: SWIFT ENGINEERING, INC., San Clemente, CA (US)

(72) Inventor: Andrew Streett, San Clemente, CA (US)

(73) Assignee: SWIFT ENGINEERING, INC., San Clemente, CA (US)

( * ) Notice: Subject to any disclaimer, the term of this patent is extended or adjusted under 35 U.S.C. 154(b) by 0 days.

(21) Appl. No.: 15/601,840

(22) Filed: May 22, 2017

(65) Prior Publication Data

US 2018/0337296 A1 Nov. 22, 2018

(51) Int. Cl.
| | |
|---|---|
| *H01L 31/048* | (2014.01) |
| *H02S 20/30* | (2014.01) |
| *B64C 3/26* | (2006.01) |
| *B29C 70/86* | (2006.01) |
| *B64C 1/12* | (2006.01) |
| *H02S 30/10* | (2014.01) |
| *B29L 31/30* | (2006.01) |
| *B29L 31/34* | (2006.01) |

(52) U.S. Cl.
CPC ........ *H01L 31/0481* (2013.01); *B29C 70/865* (2013.01); *B64C 1/12* (2013.01); *B64C 3/26* (2013.01); *H01L 31/048* (2013.01); *H02S 20/30* (2014.12); *H02S 30/10* (2014.12); *B29L 2031/3076* (2013.01); *B29L 2031/3481* (2013.01); *B29L 2031/3493* (2013.01); *B64D 2211/00* (2013.01)

(58) Field of Classification Search
CPC ........... H01L 31/02008; H01L 31/0475; H01L 31/0216; H01L 31/18; B64C 3/32; B64C 9/024; B64D 27/44; B64D 2211/00; H02S 10/40
See application file for complete search history.

(56) References Cited

U.S. PATENT DOCUMENTS

| | | | |
|---|---|---|---|
| 2004/0244829 A1* | 12/2004 | Rearick | H01L 31/048 136/251 |
| 2016/0194072 A1* | 7/2016 | Cornew | B64C 39/024 136/244 |
| 2016/0362515 A1* | 12/2016 | Klang | C08G 18/8175 |

OTHER PUBLICATIONS

Maung et al., "Multifunctional integration of thin-film silicon solar cells on carbon-fiber-reinforced epoxy composites", Solar Energy, 2010.*
2016, "Fly Forever: Solar for HALE UAVs", Alta Devices, Inc., 2 pages.
Microlink Devices, Inc., "Photovoltaics", exact publication date unknown [retrieved on Jul. 20, 2017] www.mldevices.com/index.php/product-services/photovoltaics 3 pages.

* cited by examiner

*Primary Examiner* — Matthew T Martin
(74) *Attorney, Agent, or Firm* — Perkins Coie LLP

(57) ABSTRACT

A vehicle skin, such as a composite skin for a UAV wing or other vehicle component, is co-cured with an array of solar cells to form a thin, lightweight, integrated skin structure. In one embodiment, an upper surface of the solar-cell array may be substantially coplanar with an upper surface of the composite skin. A coating, such as a spray-on fluorinated polymer coating, is applied to the upper surface of the integrated skin structure to protect the solar cells from the environment or other potentially harmful elements.

20 Claims, 1 Drawing Sheet

COMPOSITE VEHICLE SKIN CO-CURED WITH SOLAR-CELL ARRAY

BACKGROUND

Vehicle skins, such as composite wing skins used on unmanned aerial vehicles (UAVs), are often attached to an array or string of solar cells. In these devices, an encapsulated solar-cell string is directly or indirectly bonded to the composite skin after the skin has been constructed. The solar cells, for example, are commonly sandwiched between two layers of ethylene tetrafluoroethylene (ETFE) and then bonded to the skin, or bonded to the composite skin and then optically bonded to a layer of plastic, such as Mylar®. In either case, the resultant structure is relatively thick and heavy. These types of constructions are also often limited in size by the dimensions of the press used to construct the skin, or in curvature by the manner in which the solar cells are mounted to the surface of the skin.

SUMMARY

A vehicle skin, such as a composite skin for a UAV wing or other vehicle component, is co-cured with an array of solar cells to form a thin, lightweight, integrated skin structure. In one embodiment, an upper surface of the solar-cell array may be substantially coplanar with an upper surface of the composite skin. A coating, such as a spray-on fluorinated polymer coating, is applied to the upper surface of the integrated skin structure to protect the solar cells from the environment or other potentially harmful elements. Other features and advantages will appear hereinafter. The features described above can be used separately or together, or in various combinations of one or more of them.

DETAILED DESCRIPTION OF THE DRAWINGS

Various embodiments of the invention will now be described. The following description provides specific details for a thorough understanding and enabling description of these embodiments. One skilled in the art will understand, however, that the invention may be practiced without many of these details. Additionally, some well-known structures or functions may not be shown or described in detail so as to avoid unnecessarily obscuring the relevant description of the various embodiments.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this detailed description section.

Where the context permits, singular or plural terms may also include the plural or singular term, respectively. Moreover, unless the word "or" is expressly limited to mean only a single item exclusive from the other items in a list of two or more items, then the use of "or" in such a list is to be interpreted as including (a) any single item in the list, (b) all of the items in the list, or (c) any combination of items in the list. Further, unless otherwise specified, terms such as "attached" or "connected" are intended to include integral connections, as well as connections between physically separate components.

Figure 1:
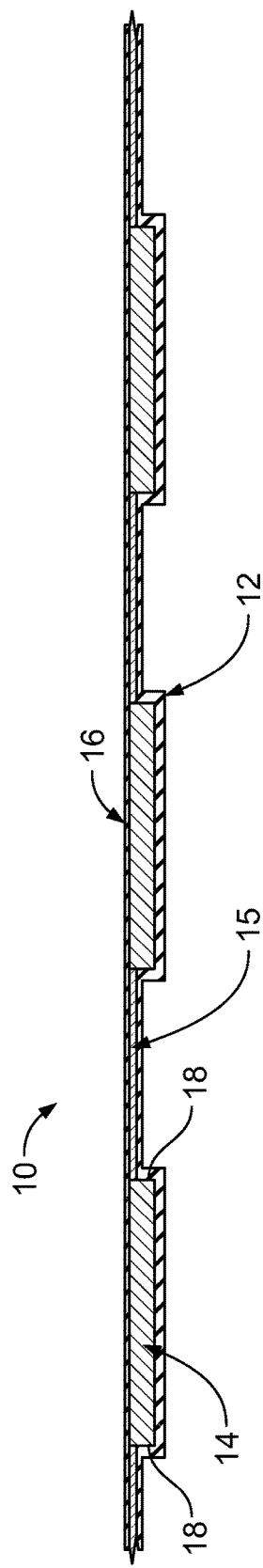
FIG. 1 is a schematic, sectional view of an integrated vehicle skin according to one embodiment of the present technology.

As shown in FIG. 1, in one embodiment, an integrated skin 10 for a vehicle component, such as for a UAV wing, a boat or submarine hull, a spacecraft wing, and so forth, includes a composite material 12 co-cured with an array of solar cells 14 ("solar array"). The composite material 12 may include a glue-based or epoxy-based resin reinforced with fibers of glass, Kevlar®, or another suitable electrically insulative material that creates electrical isolation from the solar array.

Any suitable solar cells 14 may be used, including cells physically connected by interconnects 15 in an array or string, or individual cells. For ease of description, a solar array will be discussed below. As used herein, the terms "solar array," "solar-cell array," or "array of solar cells" encompass any collection of solar cells, whether or not they are physically connected with one another.

The composite material 12 covers the bottom surfaces of the cells 14 of the solar array. In one embodiment, the composite material 12 also extends beyond one or more sides or edges 18 of one or more of the solar cells 14. One or more of the solar cells 14 may be surrounded by the composite material 12 on all sides or on fewer than all sides. As shown in FIG. 1, the upper surface of the composite material 12 extending beyond the edges 18 of the solar cells 14 may be coplanar or substantially coplanar with the upper surfaces of the cells 14 in the solar array. As used herein, the term "substantially coplanar" shall encompass embodiments in which the upper surface of the composite material 12 is coplanar or nearly coplanar with the upper surfaces of the solar cells 14.

A coating 16, such as a spray-on fluorinated polymer coating, covers the upper surface of the solar array and optionally covers the upper-surface portions of the composite material 12 extending beyond the edges 18 of the solar cells 14. The coating 16 protects the solar cells 14, and optionally the composite regions, from the environment or other potentially harmful elements, such as harmful UV radiation, transportation and handling loads, chemicals, sea water, and so forth. The coating 16 is preferably self-adhering such that a separate layer of adhesive is not required to affix the coating 16.

In one embodiment, the coating 16 is optically clear so as not to obstruct the solar cells 14 from absorbing sunlight. The coating 16, for example, may be greater than 30% transmissive, preferably greater than 75% transmissive, of light at wavelengths of 300 nm and above.

In some embodiments, the coating 16 may be applied in a manner other than spraying. In any event, it is preferable that the coating be in the form of a liquid so that it may be meaningfully thinner than the ETFE sheets and plastic sheets used in existing systems. In one embodiment, the coating 16 has a thickness of approximately 0.001 to 0.002 inches, and a weight per area of approximately 0.00003 to 0.0005 pounds per square inch. In other embodiments, thicker or thinner layers of coating 16 may be used. For example, the coating may have a thickness up to 0.005 or 0.010 inches in some cases.

By using a combination of an electrically insulative composite material co-bonded to the solar cells, the coefficient of thermal expansion (CTE) of each of these materials can be relatively similar. And the coating 16, which does not require a separate layer of adhesive to bond it to other system components, is preferably thin enough that it does not appreciably affect the CTE of the completed skin assembly. Existing systems including thick ETFE sheets or thick layers of adhesive, conversely, may experience failure under certain conditions due to the large disparities between CTE values of materials in the system.

For example, Kevlar® has a CTE of approximately $-0.5 \times 10^{-6}$/K to $-1.5 \times 10^{-6}$/K, fiberglass has a CTE of approximately $5.0 \times 10^{-6}$/K to $7.0 \times 10^{-6}$/K, and solar cells have a CTE of approximately $3.0 \times 10^{-6}$/K to $4.0 \times 10^{-6}$/K. The CTE of ETFE, conversely, is approximately $20 \times 10^{-6}$/K to $100 \times 10^{-6}$/K, while the CTE of silicone adhesives commonly used in existing systems is approximately $180 \times 10^{-6}$/K to $220 \times 10^{-6}$/K. When using materials of meaningful thickness and disparate CTE values to encapsulate the solar cells, expansion and contraction that occurs at very high or very low temperatures can cause the solar cells to crack or otherwise break. Thus, the integrated skin 10, in which the CTE values of the co-bonded materials are relatively close to each other, and the coating 16 is very thin, will be more physically stable at extreme temperatures than existing systems.

The integrated skin 10 may be formed in a mold or similar device. In one embodiment, the array of solar cells 14, or other suitable arrangement of solar cells 14, is placed face down in the mold, such that the upper surface of the solar array faces into the mold. Next, the composite material 12 is injected or otherwise introduced into the mold along the back side of the solar array. In one embodiment, a sheet of composite material 12 may be placed onto the back side of the solar array.

The mold may be configured such that the composite material 12 extends beyond one or more sides or edges 18 of one or more of the solar cells 14. In one embodiment, as shown in FIG. 1, for example, the upper surface of the composite material 12 may be substantially coplanar with the upper surfaces of the solar cells 14 on one or more sides of the solar cells 14.

Heat and pressure are applied to the mold to form the integrated skin 10. Once the integrated skin 10 cools, it may be removed from the mold. In one embodiment, a coating 16, such as a fluorinated polymer coating, may then be sprayed onto or otherwise applied to the upper surface of the solar array, and optionally onto the upper surface of the composite material located to the sides of the solar cells 14. The integrated skin 10 may then be applied or attached to a vehicle, such as a UAV wing, a boat or submarine hull, a spacecraft wing, and so forth, by bonding, fusing, mechanical attachment, or any other suitable mechanism.

The integrated skin 10 provides several advantages over existing systems. For example, it can be substantially thinner and lighter than systems employing bonded ETFE sheets or plastic coverings. The liquid polymer coating 16 may, for example, be approximately 14 times lighter and 12 times thinner than plastic coverings and adhesives used to bond the coverings, and approximately 21 times lighter and 16 times thinner than ETFE sheets and adhesives used to bond the sheets. These weight and size benefits can be achieved while maintaining the skin's surface flatness or uniformity at approximately 0.001 inches, which promotes laminar airflow across the skin 10.

The integrated skin 10 may also be unlimited in size and curvature, constrained only by the dimensions of the mold or other device in which it is formed. Existing systems, conversely, are limited by relatively small press sizes, or are limited in curvature due to the manner in which the solar cells are mounted on the skins. Thus, the integrated skin 10 may be configured for use on high-end structures having great size or curvature.

Figure 2:
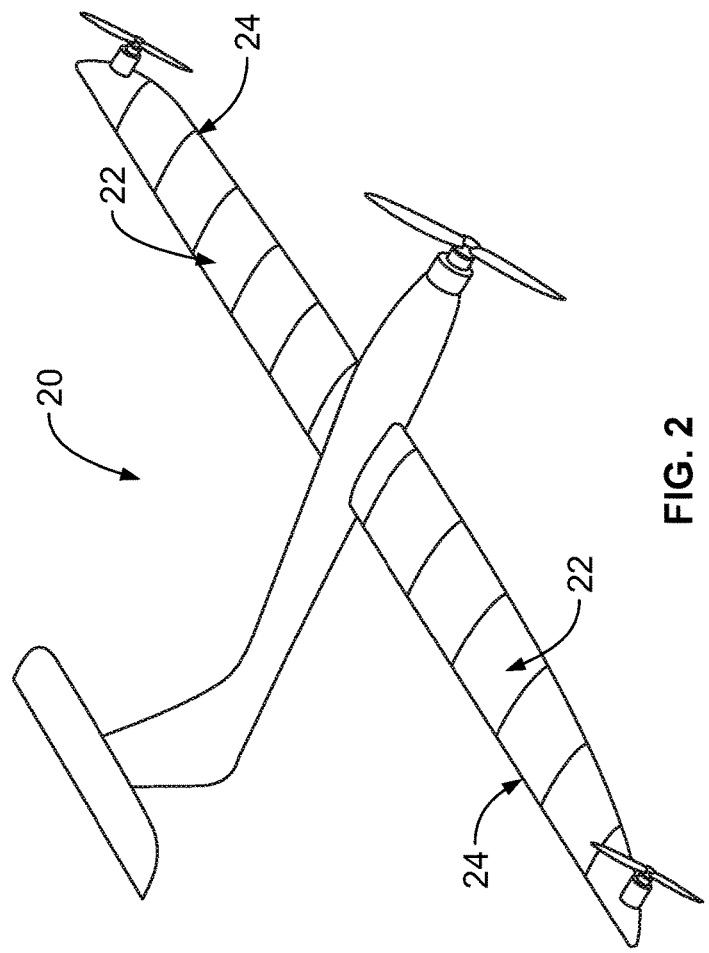
FIG. 2 is a perspective view of a UAV including integrated wing skins, according to one embodiment of the present technology.

FIG. 2 illustrates a UAV 20 including integrated skins 22, such as those described above, covering its wings 24. The integrated skins 22 may cover the entire surface area of the wings, or they may cover a lesser portion of one or both wings 24. Integrated skins 22 of this nature may also be used on other vehicles and structures, such as boat or submarine hulls, spacecraft wings, and so forth.

Any of the above-described embodiments may be used alone or in combination with one another. Further, the integrated vehicle skin may include additional features not described herein. While multiple embodiments have been described, various changes and substitutions may of course be made, without departing from the spirit and scope of the invention. The invention, therefore, should not be limited, except by the following claims and their equivalents.

What is claimed is:

1. An unmanned aerial vehicle having a wing, comprising:
   an integrated skin on the wing, the integrated skin comprising:
      a composite material co-cured with an array of solar cells such that an upper surface of the composite material is substantially coplanar with an upper surface of the solar-cell array between neighboring solar cells; and
      a liquid coating covering the upper surface of the solar-cell array, with no intervening layer of ETFE between the solar-cell array and the liquid coating.

2. The unmanned aerial vehicle of claim 1 wherein the coating covers at least a portion of the upper surface of the composite material.

3. The unmanned aerial vehicle of claim 1 wherein the composite material covers a bottom surface of the solar-cell array.

4. The unmanned aerial vehicle of claim 3 wherein the composite material extends around one or more edges of the solar-cell array.

5. The unmanned aerial vehicle of claim 1 wherein the coating comprises a sprayable fluorinated polymer coating.

6. The unmanned aerial vehicle of claim 5 wherein the fluorinated polymer coating is optically clear.

7. The unmanned aerial vehicle of claim 1 wherein the composite material comprises a glue-based or epoxy-based resin reinforced with fibers of glass or aramid.

8. The unmanned aerial vehicle of claim 1 wherein the coating has a thickness of approximately 0.001 to 0.005 inches.

9. The unmanned aerial vehicle of claim 1 wherein the coating has a weight per area of approximately 0.00003 to 0.005 pounds per square inch.

10. An unmanned aerial vehicle, comprising:
    an integrated skin on the unmanned aerial vehicle, the integrated skin comprising:
       a composite material co-cured with an array of solar cells such that the composite material covers a bottom surface of the solar-cell array; and
       an optically clear coating covering an upper surface of the solar-cell array, wherein the coating comprises a self-adhering material that is directly adhered to the upper surface of the solar-cell array without the use of a separate adhesive.

11. The unmanned aerial vehicle of claim 10 wherein the composite material extends around one or more edges of the solar-cell array.

12. The unmanned aerial vehicle of claim 10 wherein an upper surface of the composite material is substantially coplanar with the upper surface of the solar-cell array.

13. The unmanned aerial vehicle of claim 12 wherein the coating covers at least a portion of the upper surface of the composite material.

14. The unmanned aerial vehicle of claim 10 wherein the coating comprises a sprayable fluorinated polymer coating.

15. The unmanned aerial vehicle of claim 10 wherein the coating is at least 75% transmissive of light at wavelengths of 300 nm and above.

16. The unmanned aerial vehicle of claim 1 wherein the coating comprises a self-adhering material that is directly adhered to the upper surface of the solar-cell array without the use of a separate adhesive.

17. An unmanned aerial vehicle, comprising:
an integrated skin on the UAV, the integrated skin comprising
a composite material co-cured with an array of solar cells, the composite material comprising a glue-based or epoxy-based resin that is bonded to the solar-cell array without the use of a separate adhesive; and
a liquid coating covering and directly contacting an upper surface of the solar-cell array.

18. The unmanned aerial vehicle of claim 17 wherein the coating comprises a sprayable self-adhering material that is directly adhered to the upper surface of the solar-cell array without the use of a separate adhesive.

19. The unmanned aerial vehicle of claim 17 wherein an upper surface of the composite material is substantially coplanar with the upper surface of the solar-cell array between neighboring solar cells.

20. The unmanned aerial vehicle of claim 12 wherein the upper surface of the composite material is substantially coplanar with the upper surface of the solar-cell array between neighboring solar cells.

* * * * *